United States Patent
Yang (10) Patent No.: US 8,381,046 B2
(45) Date of Patent: Feb. 19, 2013

(54) METHOD FOR PREVENTING DATA SHIFT ERRORS AND CONTROLLER USING THE SAME

(75) Inventor: Tsung-Chieh Yang, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 570 days.

(21) Appl. No.: 12/633,767

(22) Filed: Dec. 8, 2009

(65) Prior Publication Data
US 2011/0010603 A1    Jan. 13, 2011

(30) Foreign Application Priority Data
Jul. 13, 2009    (TW) ................................ 98123583 A (51) Int. Cl.
*G06F 11/00*    (2006.01)
(52) U.S. Cl. ...................................................... 714/701
(58) Field of Classification Search .................. 714/701, 714/702, 752, 755, 758
See application file for complete search history.

(56) References Cited

U.S. PATENT DOCUMENTS

| | | | | |
|---|---|---|---|---|
| 5,241,546 A | * | 8/1993 | Peterson et al. | 714/761 |
| 5,712,863 A | * | 1/1998 | Gray | 714/806 |
| 6,012,839 A | * | 1/2000 | Nguyen et al. | 714/755 |
| 6,332,207 B1 | * | 12/2001 | Southerland et al. | 714/763 |
| 6,981,197 B2 | * | 12/2005 | Liu et al. | 714/765 |
| 8,112,687 B2 | * | 2/2012 | Pons et al. | 714/748 |
| 2009/0177943 A1 | * | 7/2009 | Silvus et al. | 714/755 |

* cited by examiner

*Primary Examiner* — Scott Baderman
*Assistant Examiner* — Joseph Kudirka
(74) *Attorney, Agent, or Firm* — Wang Law Firm, Inc.; Li K. Wang; Stephen Hsu (57) ABSTRACT

A method for preventing a data storage device from data shift errors is provided. First, data is encoded into an error correction code. The error correction code is then scrambled to obtain a scrambled code to be stored in a memory. The scrambled code is then retrieved from the memory to obtain first read-out data. The first read-out data is then descrambled to obtain a first descrambled error correction code. The first descrambled error correction code is then decoded to determine whether the first descrambled error correction code has uncorrectable errors. When the first descrambled error correction code has uncorrectable errors, the scrambled code stored in the memory is read again to output second read-out data without shift errors. Following, the second read-out data is then descrambled to obtain a second descrambled error correction code, and the second descrambled error correction code is then decoded to recover the data.

20 Claims, 11 Drawing Sheets

METHOD FOR PREVENTING DATA SHIFT ERRORS AND CONTROLLER USING THE SAME

CROSS REFERENCE TO RELATED APPLICATIONS

This application claims priority of Taiwan Patent Application No. TW98123583, filed on Jul. 13, 2009, the entirety of which is incorporated by reference herein.

BACKGROUND OF THE INVENTION

1. Field of the Invention

The invention relates to flash memories, and more particularly to shift errors of data output by flash memories.

2. Description of the Related Art

To prevent data from damage during storage, a data storage device usually encodes data to convert the data to an error correction code before the data is written to a memory of the data storage device. The error correction code is then stored in the memory. When the data storage device retrieves the error correction code from the memory, the error correction code must be decoded to convert the error correction code back to the original data. If it is determined during the decoding process, that the error correction code comprises error bits, the data storage device corrects the error bits during the decoding process to generate original data without error bits.

Figure 1:
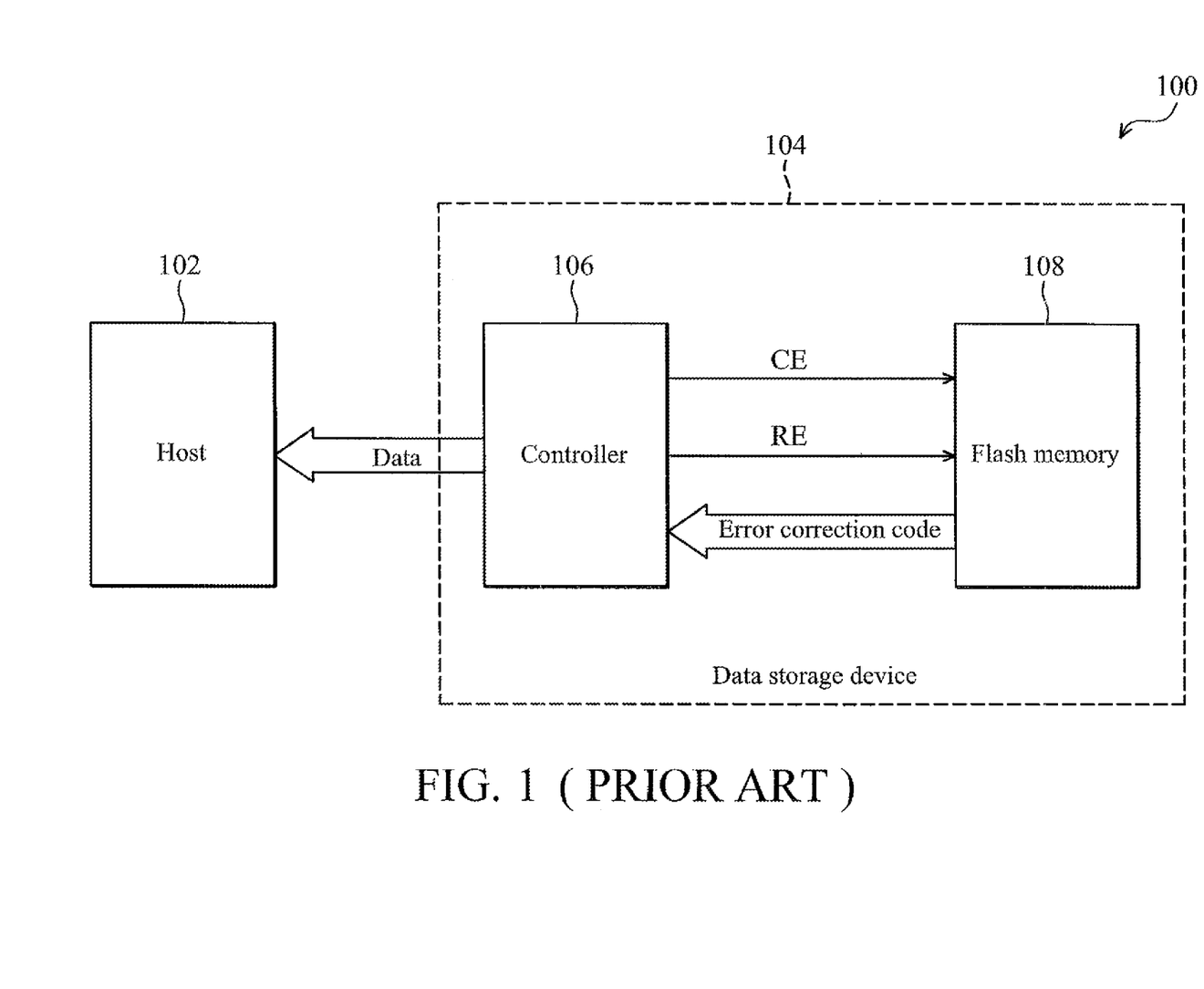
FIG. 1 is a block diagram of a data storage device.

Referring FIG. 1, a block diagram of a data storage device 104 is shown. The data storage device 104 is coupled to a host 102. The data storage device 104 comprises a controller 106 and a flash memory 108. When the host 102 requests the data storage device 104 to read data, the controller 106 sends a chip enable signals CE to the flash memory 108 to enable the flash memory 108. The controller 106 then sends a series of read enable pulses RE to the flash memory 108. The flash memory 108 then reads error correction codes stored therein and outputs the error correction codes according to the read enable pulses RE. The controller 106 then decodes the error correction codes to obtain data. If the error correction codes comprise error bits, the controller 106 corrects the error bits of the error correction codes to obtain correct data. Finally, the controller 106 sends the data to the host 102 to complete read operations.

Ordinary error correction codes, such as Bose, Ray-Chaudhuri, and Hocquenghem (BCH) codes and Reed-Solomon (RS) codes, are cyclic codes. Error bits are ordinarily corrected according to cyclic codes. When cyclic codes comprise shift errors, a controller 106 cannot detect shift errors in the cyclic codes, and the cyclic codes with shift errors are taken as correct codes. Shift errors therefore negatively impact data correctness of cyclic codes, and degrade performance of the data storage device 104.

Figure 2:
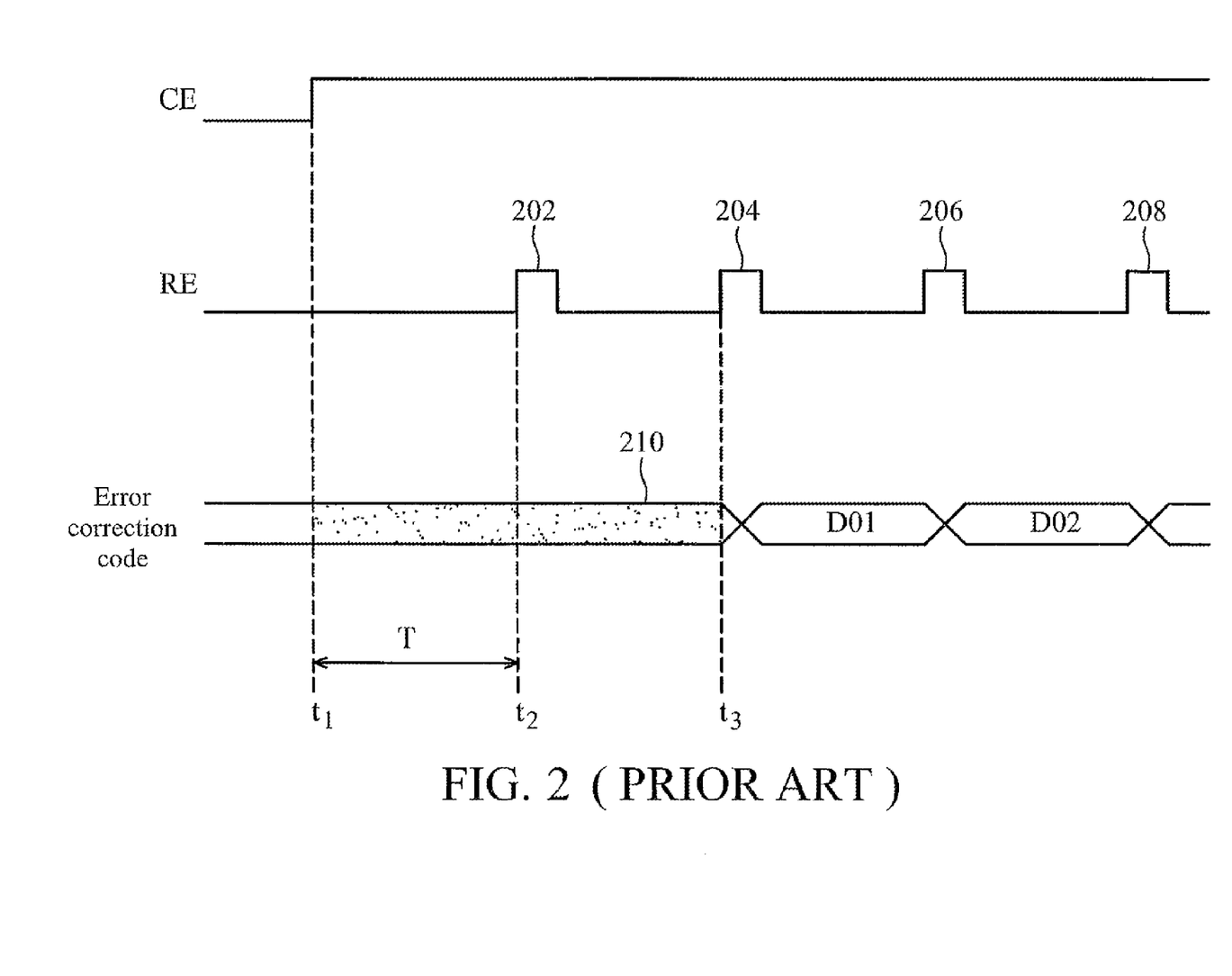
FIG. 2 is a schematic diagram of shift errors of an error correction code received by a controller from a flash memory.

Referring to FIG. 2, a schematic diagram of shift errors of an error correction code received by the controller 106 from the flash memory 108 is shown. At time t1, the controller enables the chip enable signal CE to enable the flash memory 108. After a time period T has passed, the controller 106 sends a first read enable pulse 202 to the flash memory 108 at time t2. In ordinary cases, the flash memory 108 should read an error correction code according to the read enable pulse 202 and send a first byte of the error correction code to the controller 106 before a next read enable pulse 204 is sent at time t3. In some exceptional cases, the flash memory 108, however, may require a longer time for the enabling process and may not acknowledge the read enable pulse 202 sent at time t2. The flash memory therefore reads nothing and outputs no data to a data bus connected between the controller 106 and the flash memory 108 during time t2 to t3. When the controller 106 reads the data bus connected between the controller 106 and the flash memory 108 at the time t3, the controller 108 therefore only obtains a byte comprising error bits.

The controller 106 then sends a second read enable pulse 204 to the flash memory 108 at time t3, and then reads a data byte D01 of an error correction code output by the flash memory 108. The controller 106 then sends a third read enable pulse 206 to the flash memory 108, and then reads a data byte D02 of the error correction code output by the flash memory 108. The controller 106 therefore obtains an error correction code comprising an error data byte 210 and correct data bytes D01 and D02. However, the controller 106 does not determine that an error data byte 210 exists.

Figure 3A:
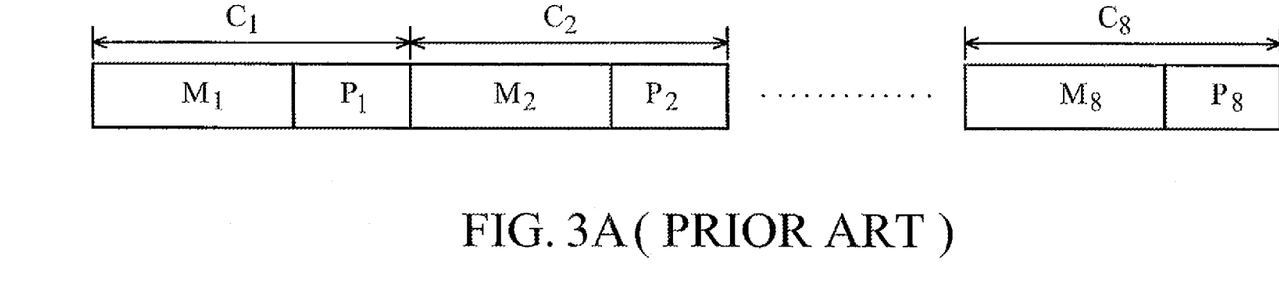
FIG. 3A is a schematic diagram of data stored in a page of a flash memory.
Figure 3B:
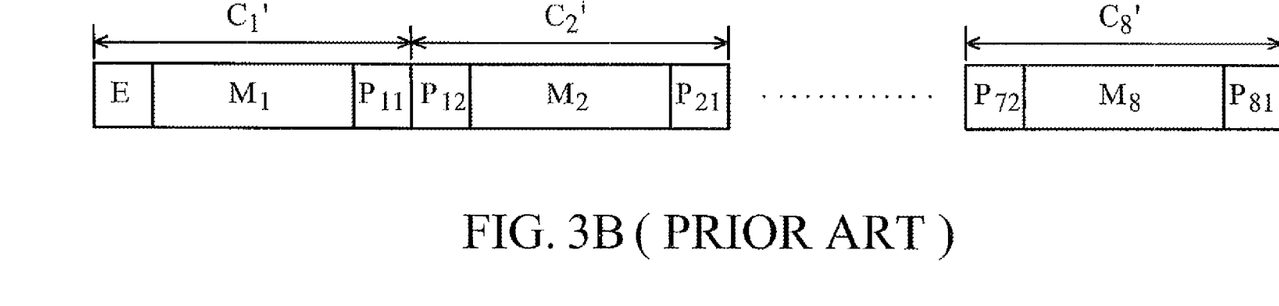
FIG. 3B is a schematic diagram of a data page with shift errors output by a flash memory.

Referring to FIG. 3A, a schematic diagram of data stored in a page of a flash memory 108 is shown. Assume that a page of the flash memory 108 can store data of 8 K bytes, the data comprises 8 code words C1, C2, ..., C8, and each code word has a 1 K-byte data amount. Also, each code word C1, C2, ..., C8 comprises a data portion M1, M2, ..., M8 and a parity portion P1, P2, ... P8. Referring to FIG. 3B, a schematic diagram of a data page with shift errors output by the flash memory 108 is shown. Assume that the controller 106 receives a data page comprising 8 1 K-byte code words C1', C2', ..., C8' with shift errors from the flash memory 108. Because the controller 106 receives an erroneous first byte E, the code word C1' comprises an error byte E, a data portion M1, and a first portion P11 of a parity P1. Similarly, the code word C2' comprises a second portion P12 of the parity P1, a data portion M2, and a first portion P21 of a parity P2. All code words C1', C2', ..., C8' received by the controller 106 therefore comprise a shift-error byte. Because the code words C1', C2', ..., C8' are cyclic codes, the controller 106 cannot detect the shift errors of the code words C1', C2', ..., C8', and the code words C1', C2', ..., C8' are determined to be correct. Thus, performance of the data storage device 104 is degraded due to shift errors of the decoded data.

BRIEF SUMMARY OF THE INVENTION

The invention provides a method for preventing data shift errors. First, data is received from a host. The data is then encoded to obtain an error correction code. The error correction code is then scrambled according to a scramble algorithm to obtain a scrambled code to be stored in a memory of a data storage device. When the host requests the data from the data storage device, the scrambled code is read from the memory to obtain a first read-out code. The first read-out code is then descrambled according to a descramble algorithm to obtain a first descrambled error correction code. The first descrambled error correction code is then decoded to determine whether the first descrambled error correction code comprises uncorrectable errors. When the first descrambled error correction code comprises uncorrectable errors, the scrambled code is read from the memory again to obtain a second read-out code without shift errors, the second read-out code is descrambled to obtain a second descrambled error correction code, and the second descrambled error correction code is then decoded. The data obtained by decoding the first descrambled error correction code or the second descrambled error correction code is then sent to the host.

A method for preventing data shift errors is provided. First, data is received from a host. The data is then encoded to obtain an error correction code. The error correction code is interleaved according to an interleave algorithm to obtain an interleaved code to be stored in a memory of a data storage device.

When the host requests the data from the data storage device, the interleaved code is read from the memory to obtain a first read-out code. The first read-out code is then deinterleaved according to a deinterleave algorithm to obtain a first deinterleaved error correction code. The first deinterleaved error correction code is then decoded to determine whether the first deinterleaved error correction code comprises uncorrectable errors. When the first deinterleaved error correction code comprises uncorrectable errors, the interleaved code is read from the memory again to obtain a second read-out code without shift errors, the second read-out code is deinterleaved to obtain a second deinterleaved error correction code, and the second deinterleaved error correction code is decoded. The data obtained by decoding the first deinterleaved error correction code or the second deinterleaved error correction code is then sent to the host.

The invention also provides a controller for preventing a data storage device from data shift errors. In one embodiment, the controller comprises an error correction code (ECC) encoder, a scrambler, a descrambler, an error correction code (ECC) decoder, and a control module. The ECC encoder encodes data received from a host to obtain an error correction code. The scrambler scrambles the error correction code according to a scramble algorithm to obtain a scrambled code to be stored in a memory of the data storage device. When the host requests the data from the data storage device, the descrambler reads the scrambled code from the memory to obtain a first read-out code, and descrambles the first read-out code according to a descramble algorithm to obtain a first descrambled error correction code. The ECC decoder decodes the first descrambled error correction code to determine whether the first descrambled error correction code comprises uncorrectable errors. When the first descrambled error correction code comprises uncorrectable errors, the control module directs the memory to once again read the scrambled code stored therein to obtain a second read-out code without shift errors, directs the descrambler to descramble the second read-out code to obtain a second descrambled error correction code, directs the ECC decoder to decode the second descrambled error correction code to obtain the data, and sends the data to the host.

The invention provides a controller for preventing a data storage device from data shift errors. In one embodiment, the controller comprises an error correction code (ECC) encoder, an interleaver, a deinterleaver, an error correction code (ECC) decoder, and a control module. The ECC encoder encodes data received from a host to obtain an error correction code. The interleaver interleaves the error correction code according to an interleave algorithm to obtain an interleaved code to be stored in a memory of a data storage device. When the host requests the data from the data storage device, the deinterleaver reads the interleaved code from the memory to obtain a first read-out code, and deinterleaves the first read-out code according to a deinterleave algorithm to obtain a first deinterleaved error correction code. The ECC decoder decodes the first deinterleaved error correction code to determine whether the first deinterleaved error correction code comprises uncorrectable errors. When the first deinterleaved error correction code comprises uncorrectable errors, the control module directs the memory to once again read the interleaved code stored therein to obtain a second read-out code without shift errors, directs the deinterleaver to deinterleave the second read-out code to obtain a second deinterleaved error correction code, directs the ECC decoder to decode the second deinterleaved error correction code to obtain the data, and sends the data to the host.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 4:
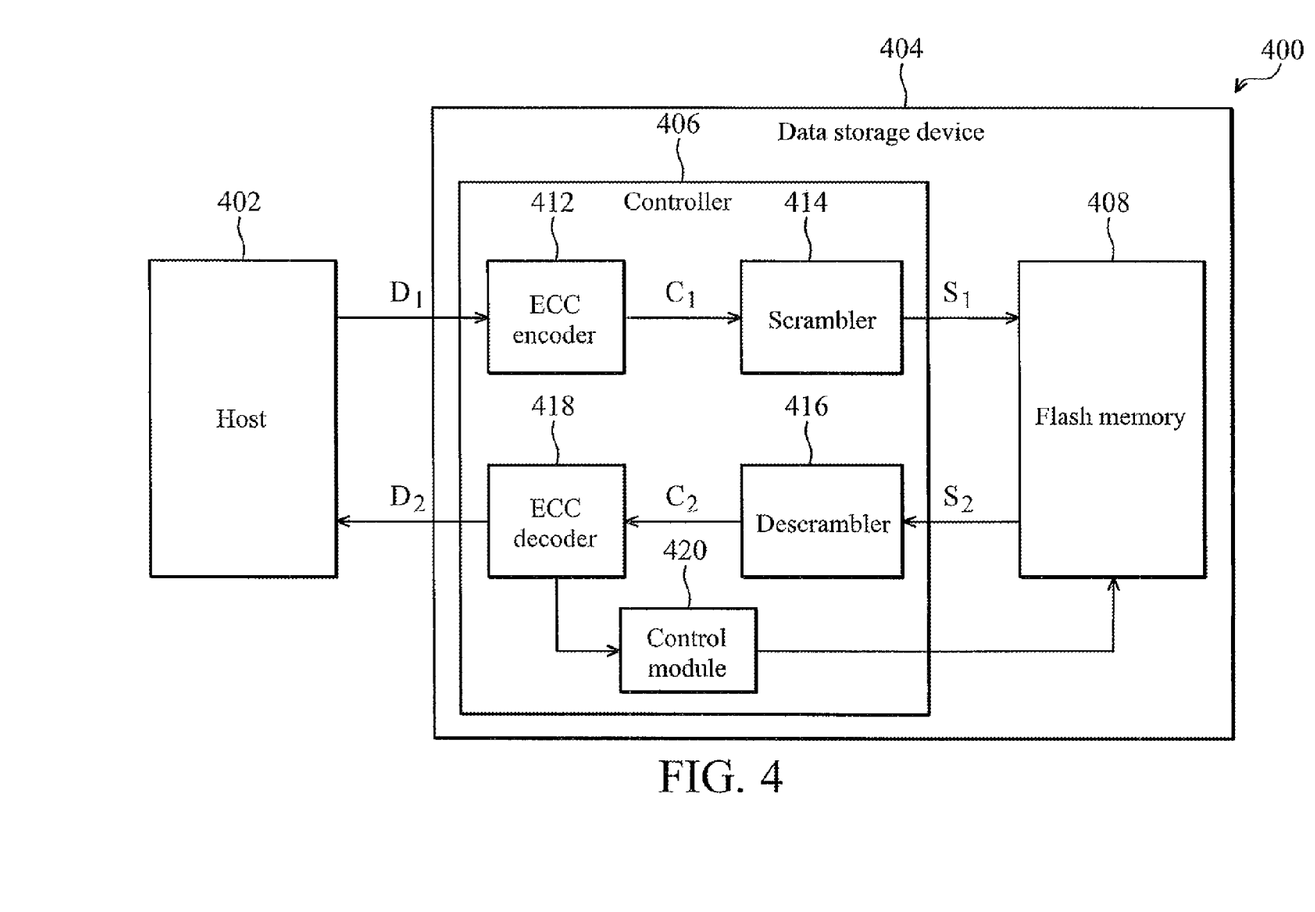
FIG. 4 is a block diagram of a data storage device capable of preventing data shift errors according to the invention.

Referring to FIG. 4, a block diagram of a data storage device 404 capable of preventing data shift errors according to the invention is shown. In one embodiment, the data storage device 404 is a memory card. The data storage device 404 is coupled to a host 402, and stores data for the host 402. The data storage device 404 comprises a controller 406 and a flash memory 408. The controller 406 writes data to the flash memory 408 or reads data from the flash memory 408 according to instructions of the host 402. In one embodiment, the controller 406 comprises an error correction code (ECC) encoder 412, a scrambler 414, a descrambler 416, an error correction code (ECC) decoder 418, and a control module 420.

Figure 5A:
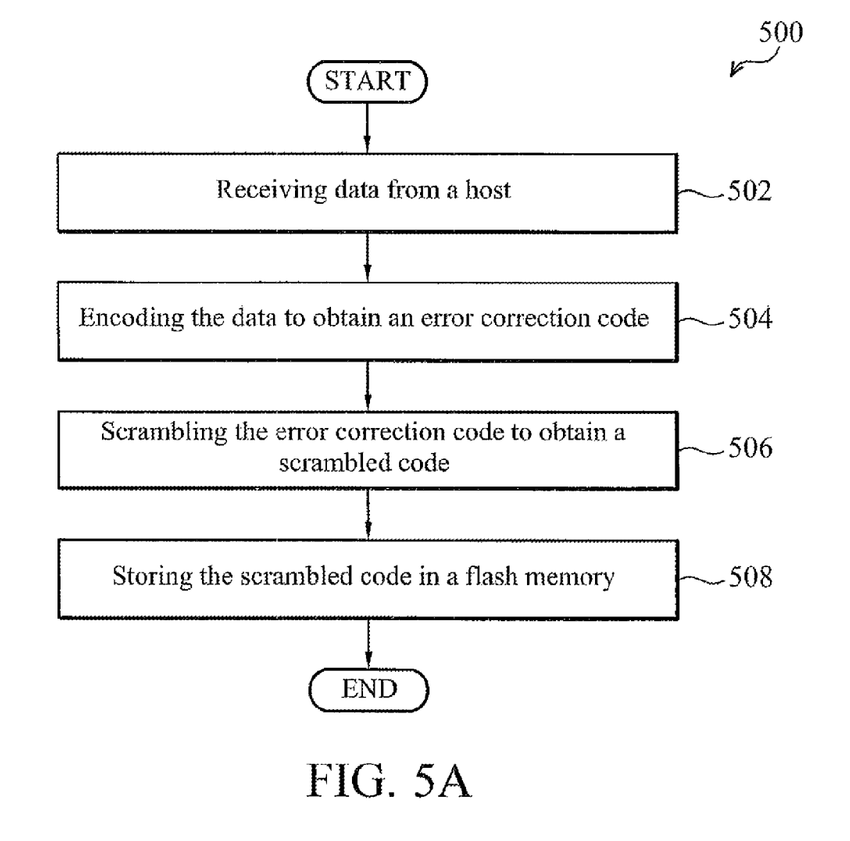
FIG. 5A is a flowchart of a method for writing data to the data storage device shown in FIG. 4 according to the invention.

Referring to FIG. 5A, a flowchart of a method 500 for writing data to the data storage device 404 according to the invention is shown. First, the controller 406 receives data D1 from the host 402 (step 502). The ECC encoder 412 then encodes data D1 to obtain an error correction code C1 (step 504). In one embodiment, the error correction code C1 is a cyclic code, such as a Bose, Ray-Chaudhuri, and Hocquenghem (BCH) code or a Reed-Solomon (RS) code. The scrambler 414 then scrambles the error correction code C1 according to a scramble algorithm to obtain a scrambled code S1 (step 506). In one embodiment, the scramble algorithm is a randomize algorithm. In another embodiment, the scrambler 414 comprises a pseudo noise generator and an XOR gate. The pseudo noise generator generates a pseudo noise, and the XOR gate performs an XOR operation on the error correction code C1 and the pseudo noise to generate the scrambled code S1. The controller 406 then stores the scrambled code in the flash memory 408 (step 508) to complete the data write operation.

Figure 5B:
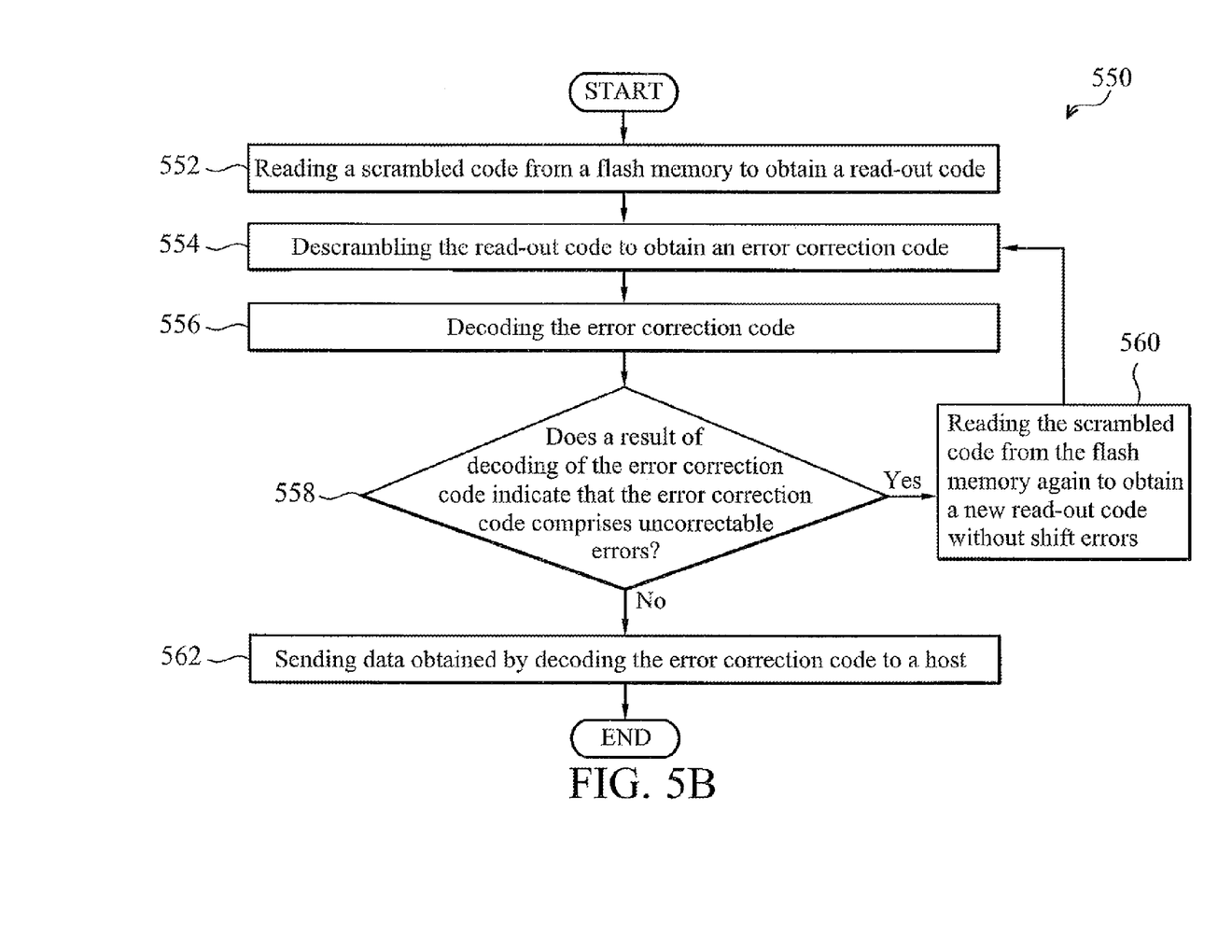
FIG. 5B is a flowchart of a method for reading data from the data storage device shown in FIG. 4 according to the invention.

Referring to FIG. 5B, a flowchart of a method 550 for reading data from the data storage device 404 according to the invention is shown. First, the controller 406 directs the flash memory 408 to read a scrambled code stored therein to obtain a read-out code S2 (step 552). The descrambler 416 then descrambles the read-out code S2 according to a descramble algorithm to obtain an error correction code C2 (step 554). In one embodiment, the descramble algorithm is a de-randomize algorithm. In another embodiment, the descrambler 416 comprises a pseudo noise generator and an XOR gate. The pseudo noise generator generates a pseudo noise, and the XOR gate performs an XOR operation on the read-out code S2 and the pseudo noise to obtain the error correction code C2. Because the pseudo noise generated by the pseudo noise generator does not comprise shift errors, if the read-out code S2 comprises shift errors, the error correction code C2 obtained by performing the XOR operation on the read-out code S2 and the pseudo noise comprises a lot of error bytes. The ECC decoder 418 then decodes the error correction code C2 to obtain the original data D2 (step 556).

If the read-out code S2 comprises shift errors, the ECC decoder 418 would determine that the error correction code C2 comprises uncorrectable errors when the ECC decoder 418 decodes the error correction code C2 (step 558). The ECC decoder 418 then sends a signal to the control module 420 to inform the control module 420 of the uncorrectable errors. The control module 420 then directs the flash memory 408 to read the scrambled code again to obtain a new read-out code S2 without shift errors (step 560), directs the descrambler 416 to descramble the new read-out code S2 to obtain a correct error correction code C2 (step 554), and then directs the ECC decoder 418 to decode the error correction code C2 to obtain the data S2 (step 556). Finally, the controller 406 sends the error correction code D2 to the host 402 to complete a data read operation (step 562).

Figures 6A, 6B, 6C:
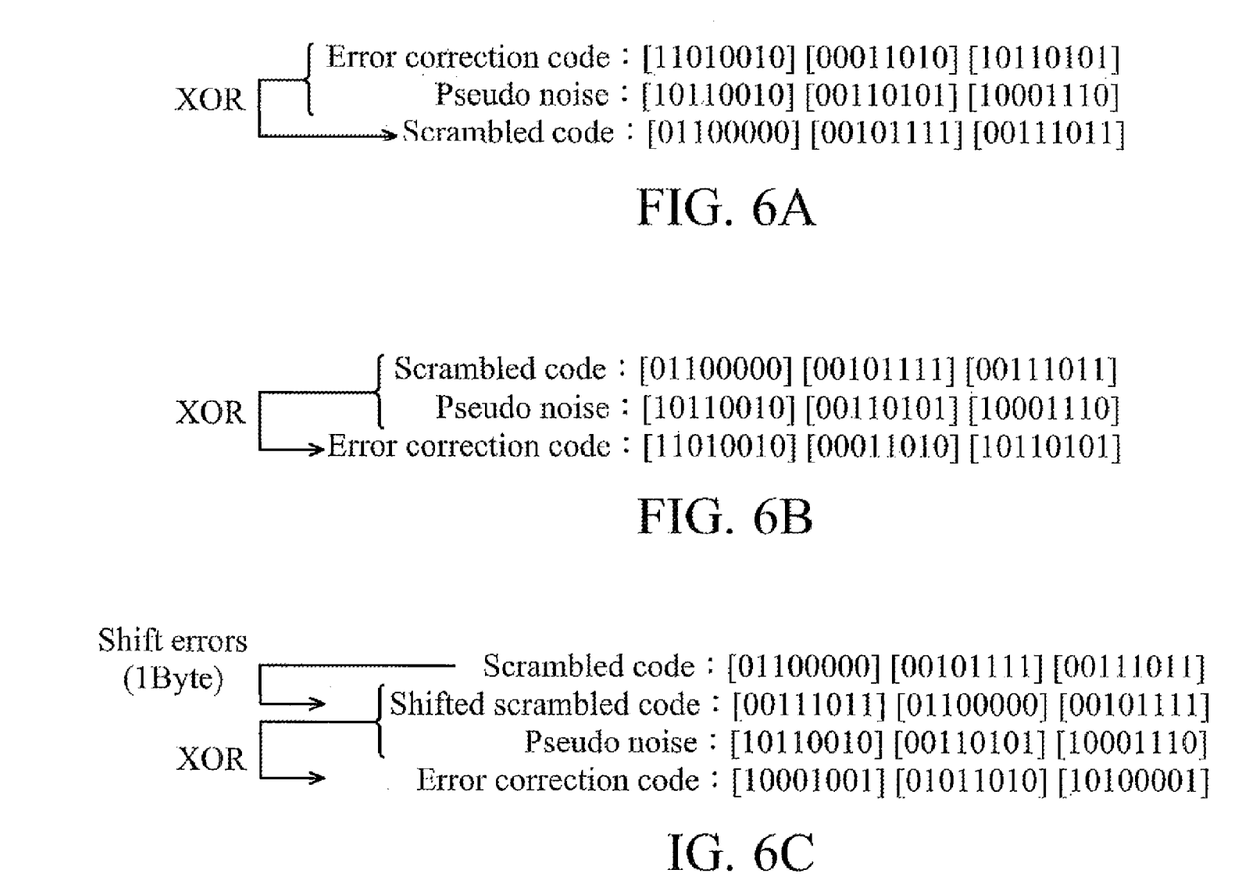
FIG. 6A is a schematic diagram of an embodiment of the data write method shown in FIG. 5.
FIG. 6B is a schematic diagram of an embodiment of the data read method shown in FIG. 5B when data shift errors do not occur.
FIG. 6C is a schematic diagram of an embodiment of the data read method shown in FIG. 5B when data shift errors occur.

Referring to FIG. 6A, a schematic diagram of an embodiment of the data write method 500 is shown. Assume that the ECC encoder 412 encodes data to obtain an error correction code C1 comprising 3 data bytes of [11010010], [00011010], and [10110101], and a pseudo noise generator of the scrambler 414 generates a pseudo noise comprising 3 data bytes of [10110010], [00110101], and [10001110]. An XOR gate of the scrambler 414 then performs an XOR operation on the error correction code C1 and the pseudo noise to obtain a scrambled code S1 comprising 3 data bytes of [01100000], [00101111], and [00111011]. The scrambled code S1 is then stored in the flash memory 408. Referring to FIG. 6B, a schematic diagram of an embodiment of the data read method 550 when data shift errors do not occur is shown. Because there are no data shift errors, the controller 406 receives a read-out code S2 comprising 3 data bytes of [01100000], [00101111], and [00111011] when the flash memory reads the scrambled code S2 stored therein. Assume that a pseudo noise generator of the descrambler 416 generates a pseudo noise comprising three data bytes of [10110010], [00110101], and [10001110], when an XOR gate of the descrambler 416 performs an XOR operation of the read-out code S2 and the pseudo noise, an error correction code C2 comprising three correct data bytes of [11010010], [00011010], and [10110101] is obtained.

Referring to FIG. 6C, a schematic diagram of an embodiment of the data read method 550 when data shift errors occur is shown. When the flash memory 408 reads the scrambled code S1 stored therein, 1-byte data shift errors occur, and the controller 406 receives a read-out code S2 comprising three data bytes of [00111011], [01100000], and [00101111], wherein the first byte [00111011] of the read-out code S2 is a noise appearing on the data bus connected to the controller 406 and the flash memory 408 during a period between time t2 and t3 as shown in FIG. 2. Assume that a pseudo noise generator of the descrambler 416 generates a pseudo noise comprising three data bytes of [10110010], [00110101], and [10001110], when an XOR gate of the descrambler 416 performs an XOR operation of the read-out code S2 and the pseudo noise, an error correction code C2 comprising three data bytes of [10001001], [01011010], and [10100001] is obtained. In comparison with the correct error correction code C2 obtained in the embodiment of FIG. 6B, the error correction code C2 obtained in the embodiment of FIG. 6C comprises 8 error bits. If the ECC decoder 418 has an error correction capability of lower than 8 error bits such as 4 error bits, the ECC decoder 418 would determine that the error correction code C2 comprises uncorrectable errors. The control module 420 would then direct the flash memory 408 to read the scrambled code S1 stored therein again to obtain a new read-out code S2 without data shift errors. In comparison with a convention method, the data write method 500 and the data read method 550 provided by the invention can prevent a cyclic code from data shift errors, thus improving the performance of the data storage device 404.

Figure 7:
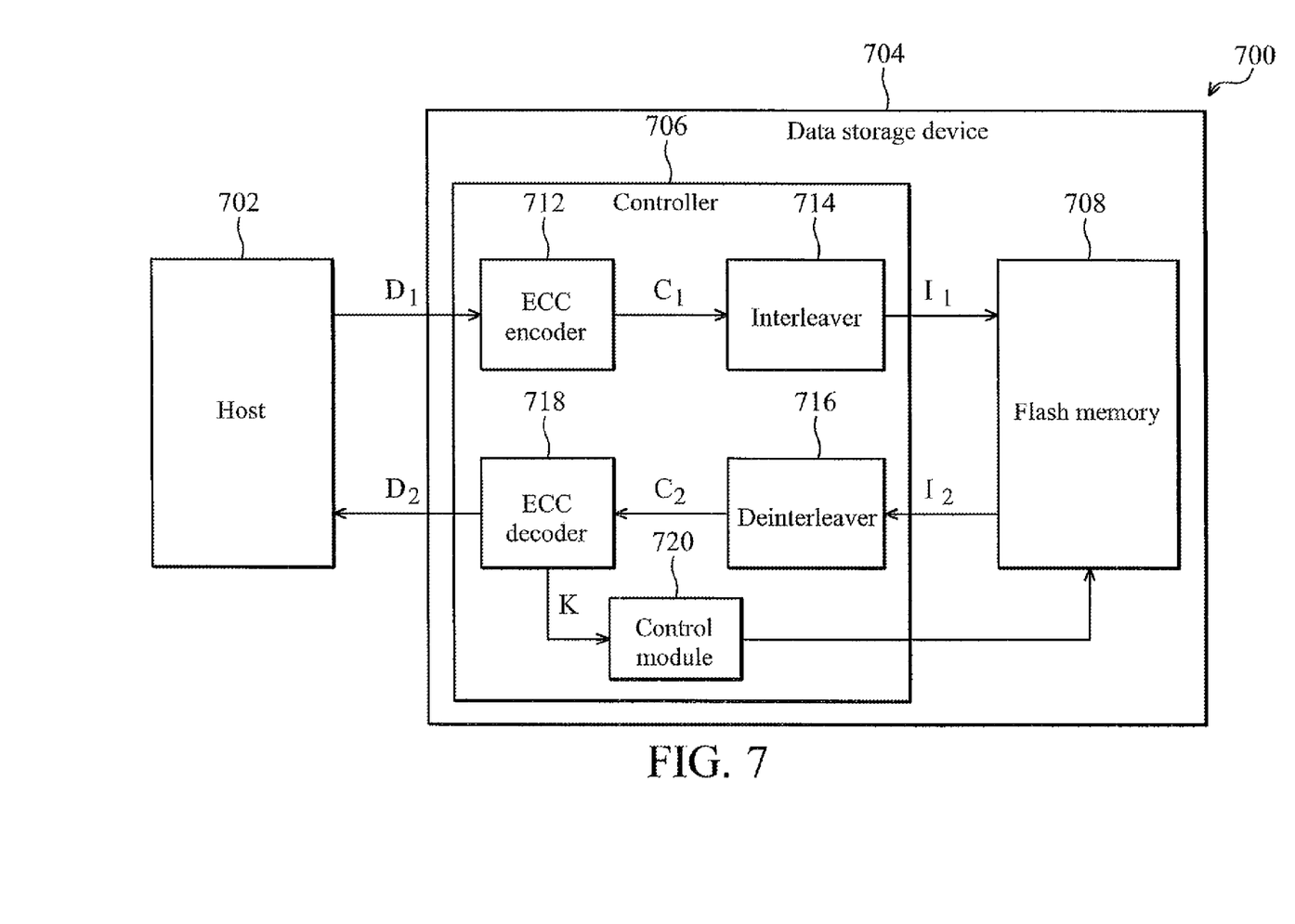
FIG. 7 is a block diagram of a data storage device capable of preventing data shift errors according to the invention.

Referring to FIG. 7, a block diagram of a data storage device 704 capable of preventing data shift errors according to the invention is shown. In one embodiment, the data storage device 704 is a memory card. The data storage device 704 is coupled to a host 702, and stores data for the host 702. The data storage device 704 comprises a controller 706 and a flash memory 708. The controller 706 writes data to the flash memory 708 or reads data from the flash memory 708 according to instructions of the host 702. In one embodiment, the controller 706 comprises an error correction code (ECC) encoder 712, an interleaver 714, a deinterleaver 716, an error correction code (ECC) decoder 718, and a control module 720.

Figure 8A:
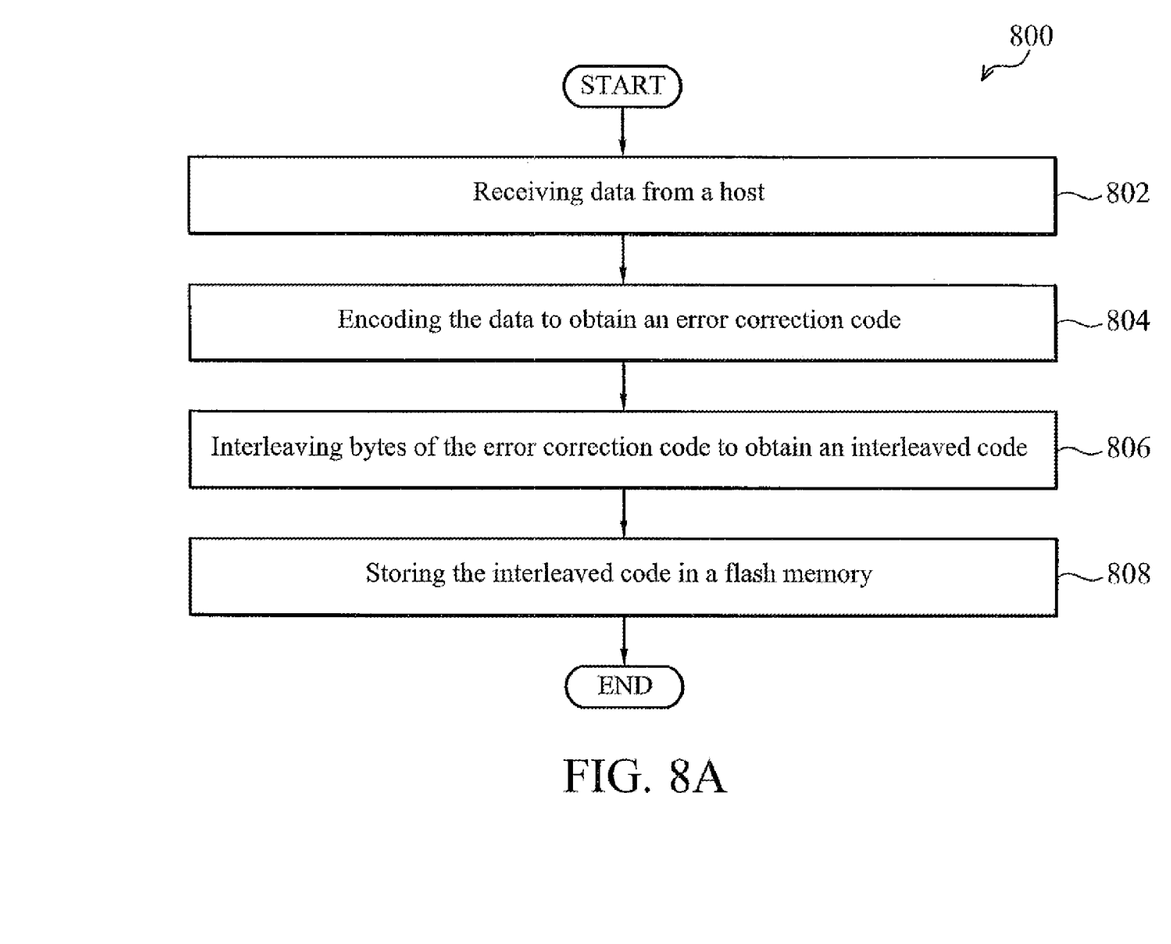
FIG. 8A is a flowchart of a method for writing data to the data storage device shown in FIG. 7 according to the invention.

Referring to FIG. 8A, a flowchart of a method 800 for writing data to the data storage device 704 according to the invention is shown. First, the controller 706 receives data D1 from the host 702 (step 802). The ECC encoder 712 then encodes data D1 to obtain an error correction code C1 (step 804). In one embodiment, the error correction code C1 is a cyclic code, such as a Bose, Ray-Chaudhuri, and Hocquenghem (BCH) code or a Reed-Solomon (RS) code. The interleaver 714 then interleaves the error correction code C1 according to an interleave algorithm to obtain an interleaved code I1 (step 806). In one embodiment, the interleaver 714 alters a sequence of bytes of the error correction code C1 to obtain the interleaved code I1. In another embodiment, the interleaver 714 alters a sequence of every four bytes of the error correction code C1 to obtain the interleaved code I1. The controller 706 then stores the interleaved code I1 in the flash memory 708 (step 808) to complete the data write operation.

Figure 8B:
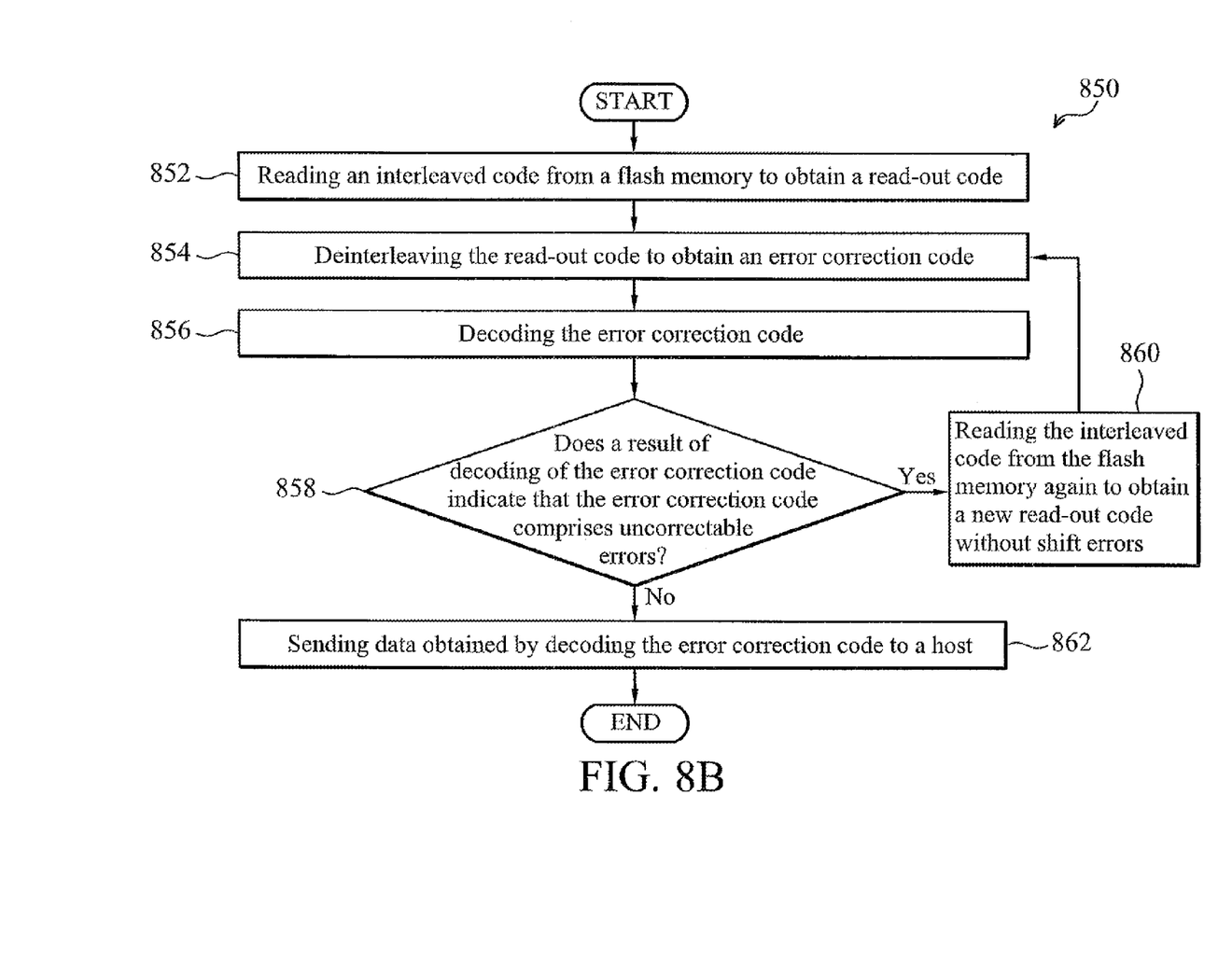
FIG. 8B is a flowchart of a method for reading data from the data storage device shown in FIG. 7 according to the invention.

Referring to FIG. 8B, a flowchart of a method 850 for reading data from the data storage device 704 according to the invention is shown. First, the controller 706 directs the flash memory 708 to read an interleaved code stored therein to obtain a read-out code I2 (step 852). The deinterleaver 716 then deinterleaves the read-out code I2 according to a deinterleave algorithm to obtain an error correction code C2 (step 854). In one embodiment, the deinterleaver 716 recovers an original sequence of bytes of the read-out code I2 to obtain the deinterleaved error correction code C2. Because the deinterlaver 716 recovers the error correction code C2 according to the original byte sequence of the original error correction code C1 without data shift errors, if the read-out code I2 comprises shift errors, the error correction code C2 obtained by the read-out code I2 comprises a lot of error bytes. The ECC decoder 718 then decodes the error correction code C2 to obtain the original data D2 (step 856).

If the read-out code I2 comprises shift errors, the ECC decoder 718 determines that the error correction code C2 comprises uncorrectable errors when the ECC decoder 718 decodes the error correction code C2 (step 858). The ECC decoder 718 then sends a signal to the control module 720 to inform the control module 720 of the uncorrectable errors. The control module 720 then directs the flash memory 708 to read the interleaved code again to obtain a new read-out code I2 without shift errors (step 860), directs the deinterleaver 716 to deinterleave the new read-out code I2 to obtain a correct error correction code C2 (step 854), and then directs the ECC decoder 718 to decode the error correction code C2 to obtain the data S2 (step 856). Finally, the controller 706 sends the error correction code D2 to the host 702 to complete a data read operation (step 862).

Figure 9A:
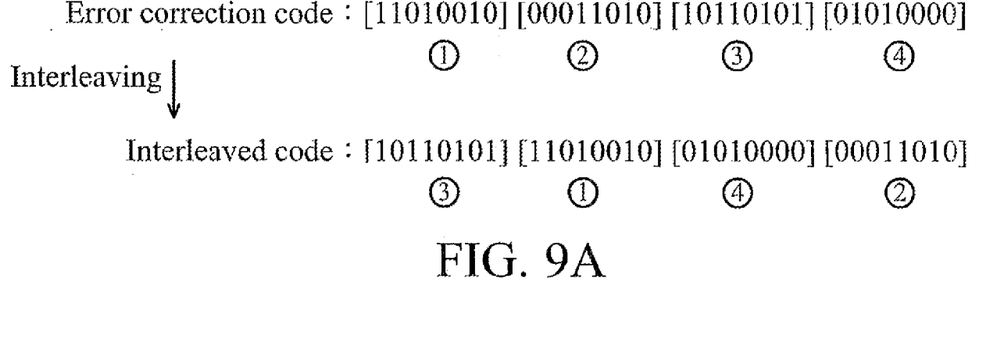
FIG. 9A is a schematic diagram of an embodiment of the data write method shown in FIG. 8A.
Figure 9B:
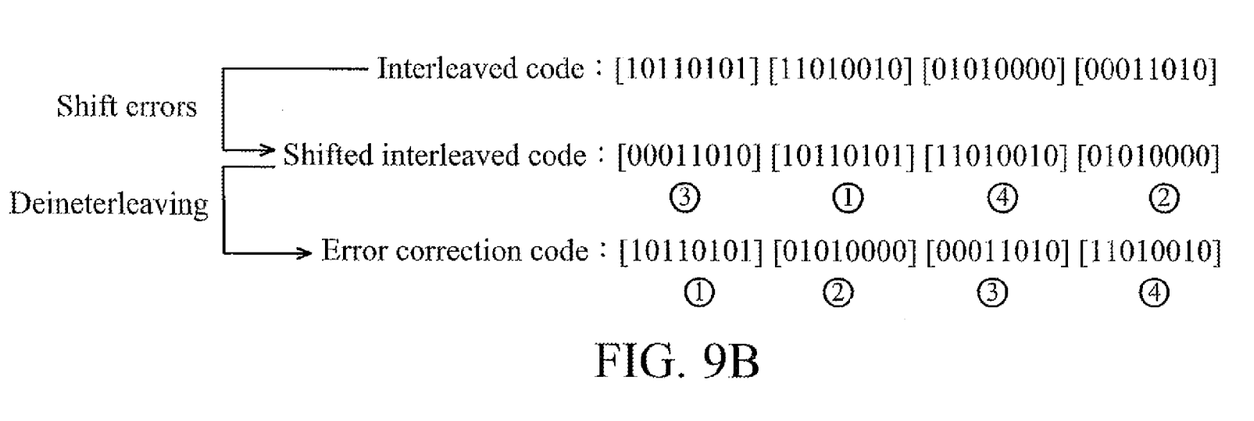
FIG. 9B is a schematic diagram of an embodiment of the data read method shown in FIG. 8B when data shift errors occur.

Referring to FIG. 9A, a schematic diagram of an embodiment of the data write method 800 is shown. Assume that the ECC encoder 712 encodes data D1 to obtain an error correction code C1 comprising 4 data bytes of [11010010], [00011010], [10110101], and [01010000], and the interleaver 714 alters a byte sequence of the error correction code C1 from ①②③④ to ③①④②. The interleaver 714 therefore generates an interleaved code I1 comprising 4 data bytes of [10110101], [11010010], [01010000], and [00011010]. The interleaved code I1 is then stored in the flash memory 708. Referring to FIG. 9B, a schematic diagram of an embodiment of the data read method 850 when data shift errors occur is shown. When the flash memory 708 reads the interleaved code I1 stored therein, 1-byte data shift errors occur, and the controller 706 receives a read-out code I2 comprising four data bytes of [00011010], [10110101], [11010010], and [01010000], wherein the first byte [00011010] of the read-out code I2 is a noise appearing on the data bus connected the controller 706 and the flash memory 708 during a period between time t2 and t3 shown in FIG. 2. Assume that the deinterleaver 716 recovers an error correction code C2 by changing the byte sequence of the read-out code I2 from ③①④② to ①②③④. The deinterleaver 716 therefore obtains an error correction code C2 comprising four data bytes of [10110101], [01010000], [00011010], and [11010010]. In comparison with the error correction code C1 shown in the embodiment of FIG. 9A, the error correction code C2 obtained in the embodiment of FIG. 9B comprises 10 error bits. If the ECC decoder 718 has an error correction capability of lower than 10 error bits such as 8 error bits, the ECC decoder 718 would determine that the error correction code C2 comprises uncorrectable errors. The control module 720 would then direct the flash memory 708 to read the interleaved code I1 stored therein again to obtain a new read-out code I2 without data shift errors. In comparison with a convention method, the data write method 800 and the data read method 850 provided by the invention can prevent a cyclic code from data shift errors, thus improving the performance of the data storage device 704.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for preventing data shift errors, comprising:
receiving data from a host;
encoding the data to obtain an error correction code;
scrambling the error correction code according to a scramble algorithm to obtain a scrambled code to be stored in a memory of a data storage device;
when the host requests the data from the data storage device, reading the scrambled code from the memory to obtain a first read-out code;
descrambling the first read-out code according to a descramble algorithm to obtain a first descrambled error correction code;
decoding the first descrambled error correction code to determine whether the first descrambled error correction code comprises uncorrectable errors;
when the first descrambled error correction code comprises uncorrectable errors, re-reading the scrambled code from the memory to obtain a second read-out code without shift errors, descrambling the second read-out code to obtain a second descrambled error correction code, and decoding the second descrambled error correction code; and
sending the data obtained by decoding the first descrambled error correction code or the second descrambled error correction code to the host.

2. The method as claimed in claim 1, wherein the scramble algorithm is a randomize algorithm and the descramble algorithm is a de-randomize algorithm.

3. The method as claimed in claim 1, wherein scrambling of the error correction code comprises:
generating a pseudo noise; and
performing an XOR operation on the error correction code and the pseudo noise to obtain the scrambled code.

4. The method as claimed in claim 3, wherein descrambling of the first read-out code comprises:
regenerating the pseudo noise;
performing an XOR operation on the first read-out code and the pseudo noise to obtain the first descrambled error correction code.

5. The method as claimed in claim 1, wherein the error correction code is a cyclic-base error correction code.

6. The method as claimed in claim 1, wherein the error correction code is a Bose, Ray-Chaudhuri, and Hocquenghem (BCH) code or a Reed-Solomon (RS) code.

7. A method for preventing data shift errors, comprising:
receiving data from a host;
encoding the data to obtain an error correction code;

interleaving the error correction code according to an interleave algorithm to obtain an interleaved code to be stored in a memory of a data storage device;

when the host requests the data from the data storage device, reading the interleaved code from the memory to obtain a first read-out code;

deinterleaving the first read-out code according to a deinterleave algorithm to obtain a first deinterleaved error correction code;

decoding the first deinterleaved error correction code to determine whether the first deinterleaved error correction code comprises uncorrectable errors;

when the first deinterleaved error correction code comprises uncorrectable errors, re-reading the interleaved code from the memory to obtain a second read-out code without shift errors, deinterleaving the second read-out code to obtain a second deinterleaved error correction code, and decoding the second deinterleaved error correction code; and sending the data obtained by decoding the first deinterleaved error correction code or the second deinterleaved error correction code to the host.

8. The method as claimed in claim 7, wherein interleaving of the error correction code comprises altering a sequence of bytes of the error correction code to obtain the interleaved code.

9. The method as claimed in claim 7, wherein deinterleaving of the first read-out code comprises recovering an original sequence of bytes of the first read-out code to obtain the first deinterleaved error correction code.

10. The method as claimed in claim 7, wherein interleaving of the error correction code comprises altering a sequence of every four bytes of the error correction code to obtain the interleaved code.

11. The method as claimed in claim 7, wherein the error correction code is a Bose, Ray-Chaudhuri, and Hocquenghem (BCH) code or a Reed-Solomon (RS) code.

12. A data storage device, comprising:
a memory; and
a controller, preventing the data storage device from data shift errors, and comprising:
an error correction code (ECC) encoder, encoding data received from a host to obtain an error correction code;
a scrambler, scrambling the error correction code according to a scramble algorithm to obtain a scrambled code to be stored in the memory;
a descrambler, when the host requests the data from the data storage device, reading the scrambled code from the memory to obtain a first read-out code, and descrambling the first read-out code according to a descramble algorithm to obtain a first descrambled error correction code;
an error correction code (ECC) decoder, decoding the first descrambled error correction code to determine whether the first descrambled error correction code comprises uncorrectable errors; and
a control module, when the first descrambled error correction code comprises uncorrectable errors, directing the memory to re-read the scrambled code stored therein to obtain a second read-out code without shift errors, directing the descrambler to descramble the second read-out code to obtain a second descrambled error correction code, directing the ECC decoder to decode the second descrambled error correction code to obtain the data, and sending the data to the host.

13. The data storage device as claimed in claim 12, wherein the scramble algorithm is a randomize algorithm and the descramble algorithm is a de-randomize algorithm.

14. The data storage device as claimed in claim 12, wherein the scrambler comprises:
a first pseudo noise generator, generating a pseudo noise; and
a first XOR gate, performing an XOR operation on the error correction code and the pseudo noise to obtain the scrambled code.

15. The data storage device as claimed in claim 14, wherein the descrambler comprises:
a second pseudo noise generator, regenerating the pseudo noise; and
a second XOR gate, performing an XOR operation on the first read-out code and the pseudo noise to obtain the first descrambled error correction code.

16. The data storage device as claimed in claim 12, wherein the error correction code is a cyclic-base error correction code.

17. The data storage device as claimed in claim 12, wherein the error correction code is a Bose, Ray-Chaudhuri, and Hocquenghem (BCH) code or a Reed-Solomon (RS) code.

18. A data storage device, comprising:
a memory; and
a controller, preventing the data storage device from data shift errors, comprising:
an error correction code (ECC) encoder, encoding data received from a host to obtain an error correction code;
an interleaver, interleaving the error correction code according to an interleave algorithm to obtain an interleaved code to be stored in the memory;
a deinterleaver, when the host requests the data from the data storage device, reading the interleaved code from the memory to obtain a first read-out code, and deinterleaving the first read-out code according to a deinterleave algorithm to obtain a first deinterleaved error correction code;
an error correction code (ECC) decoder, decoding the first deinterleaved error correction code to determine whether the first deinterleaved error correction code comprises uncorrectable errors; and
a control module, when the first deinterleaved error correction code comprises uncorrectable errors, directing the memory to re-read the interleaved code stored therein to obtain a second read-out code without shift errors, directing the deinterleaver to deinterleave the second read-out code to obtain a second deinterleaved error correction code, directing the ECC decoder to decode the second deinterleaved error correction code to obtain the data, and sending the data to the host.

19. The data storage device as claimed in claim 18, wherein the interleaver alters a sequence of bytes of the error correction code to obtain the interleaved code.

20. The data storage device as claimed in claim 19, wherein the deinterleaver recovers an original sequence of bytes of the first read-out code to obtain the first deinterleaved error correction code.

* * * * *